US010796036B2

(12) United States Patent
Bai et al.

(10) Patent No.: US 10,796,036 B2
(45) Date of Patent: Oct. 6, 2020

(54) PREDICTION OF INHALABLE PARTICLES CONCENTRATION

(71) Applicant: International Business Machines Corporation, Armonk, NY (US)

(72) Inventors: Xin Xin Bai, Beijing (CN); Xiao Guang Rui, Beijing (CN); Ling Yun Wang, Beijing (CN); Xi Xia, Beijing (CN); Chao Zhang, Beijing (CN); Wei Zhao, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 859 days.

(21) Appl. No.: 15/230,799

(22) Filed: Aug. 8, 2016

(65) Prior Publication Data
US 2018/0039718 A1    Feb. 8, 2018

(51) Int. Cl.
G06F 30/20    (2020.01)
(52) U.S. Cl.
CPC .................. G06F 30/20 (2020.01)
(58) Field of Classification Search
CPC ........... G06N 3/08; G06N 20/00; G06N 20/20
USPC .......................................... 706/46
See application file for complete search history.

(56) References Cited

U.S. PATENT DOCUMENTS

| | | | | |
|---|---|---|---|---|
| 7,818,224 B2 * | 10/2010 | Boerner | .................. | G06F 17/18 705/35 |
| 10,136,273 B2 * | 11/2018 | Chen | ..................... | H04W 4/023 |
| 10,317,572 B2 * | 6/2019 | Liu | .......................... | G01W 1/02 |
| 10,324,459 B2 * | 6/2019 | Lv | ............................ | G06Q 50/06 |
| 10,359,280 B2 * | 7/2019 | Bai | ........................ | G01N 33/00 |
| 10,360,538 B2 * | 7/2019 | Bai | ........................ | G06Q 10/04 |
| 10,372,846 B2 * | 8/2019 | Bai | ........................ | G01W 1/10 |
| 10,438,125 B2 * | 10/2019 | Bai | ........................ | G06N 7/00 |
| 10,444,211 B2 * | 10/2019 | Bai | ........................ | G01W 1/10 |
| 10,555,226 B2 * | 2/2020 | Cao | .................. | H04W 36/0094 |
| 10,571,446 B2 * | 2/2020 | Cheng | ............... | G01N 15/0618 |
| 10,578,448 B2 * | 3/2020 | Ba | ...................... | G01C 21/3461 |

(Continued)

FOREIGN PATENT DOCUMENTS

| | | |
|---|---|---|
| CN | 103942439 A | 7/2014 |
| KR | 102009009812 A | 9/2009 |

OTHER PUBLICATIONS

Lu, W.-Z., et al., "Potential assessment of the "support vector machine" method in forecasting ambient air pollutant trends", 2005, Chemosphere, p. 693-701 (Year: 2005).*

(Continued)

*Primary Examiner* — Michael B Holmes
(74) *Attorney, Agent, or Firm* — Scully, Scott, Murphy & Presser, P.C.; Joseph Petrokaitis, Esq.

(57) ABSTRACT

In an embodiment of the present disclosure, a method for modeling prediction of inhalable particles concentration is disclosed. In the method, at least one dispersal event is identified, and at least one accumulation event is identified based on the identified at least one dispersal event. Then a dispersal prediction model is generated based on the identified at least one dispersal event. Then at least one accumulation level of inhalable particles concentration is obtained for the at least one accumulation event. A change prediction model for the accumulation level is generated. Then a plurality of accumulation prediction models is

(56) References Cited

U.S. PATENT DOCUMENTS 10,627,380 B2* 4/2020 Ba ................. G01N 33/0032
10,648,805 B2* 5/2020 Bai ................. G01B 21/16

OTHER PUBLICATIONS

Wang, F., et al., "Identification of regional atmospheric PM10 transport pathways using HYSPLIT, MM5-CMAQ and synoptic pressure pattern analysis", 2010, Environmental Modelling & Software 25, p. 927-934 (Year: 2010).*

Grivas, G., et al., "Artificial neural network models for prediction of PM10 hourly concentrations, in the Greater Area of Athens, Greece", 2006, Atmospheric Environment 40, p. 1216-1229 (Year: 2006).*

Anonymous, "A method to predict air pollution based on wrf-chem model and statistical model", IP.com Prior Art Database Technical Disclosure, IP.com No. 000242026, Jun. 15, 2015.

* cited by examiner

S602 — ESTABLISH A FIRST MODEL

S606 — COMPUTE A DECREASED AMOUNT OF INHALABLE PARTICLES CONCENTRATION

S608 — ESTABLISH A SECOND MODEL

S610 — GENERATE A DISPERSAL PREDICTION MODEL

Figure 6

```
          ┌──────────────────────────┐ ╱ S802
          │  IDENTIFY AT LEAST ONE   │
          │    DISPERSAL EVENT       │
          └──────────────┬───────────┘
                         │
                         ▼           ╱ S804
          ┌──────────────────────────┐
          │  IDENTIFY AT LEAST ONE   │
          │   ACCUMULATION EVENT     │
          └──────────────┬───────────┘
                         │
                         ▼           ╱ S806
          ┌──────────────────────────┐
          │ OBTAIN A VARIATION AMOUNT OF │
          │  ACCUMULATION LEVEL FOR  │
          │    ACCUMULATION EVENT    │
          └──────────────┬───────────┘
                         │
                         ▼           ╱ S808
          ┌──────────────────────────┐
          │ PREDICT INHALABLE PARTICLES │
          │  CONCENTRATION IN DISPERSAL │
          │  EVENTS AND ACCUMULATION │
          │          EVENTS          │
          └──────────────────────────┘
```

Figure 8

PREDICTION OF INHALABLE PARTICLES CONCENTRATION

BACKGROUND

The present invention relates to forecasting of air pollution, and more specifically, to prediction of inhalable particles concentration.

Inhalable particles, which are not greater than 10 micrometers in diameter in the atmosphere, are main air pollutants. The inhalable particles can be inhaled by people and do harm to health of the people. Nowadays Inhalable particles concentration becomes an index of air pollution. By forecasting the inhalable particles concentration, prevention actions may be taken in advance to alleviate the pollution.

There are various methods for prediction of inhalable particles concentration. One is a prediction method based on a physical model, such as WRF-CHEM model (Weather Research and Forecasting model coupled with Chemistry), CMAQ (Community Multiscale Air Quality) model. This kind of method depends on full scale (e.g. regional-scale) and precise data source, including emission, transport, mixing, and chemical transformation of trace gases and aerosols, and weather. As it is very hard to acquire the accurate data, the prediction accuracy is low.

Another method is based on a statistical model which is trained using weather information. As the statistical model is related to average of the weather information, this kind of method has bad performance in high pollutant prediction.

SUMMARY

According to one embodiment of the present invention, there is provided a computer-implemented method for modeling prediction of inhalable particles concentration. In the method, at least one dispersal event is identified, and at least one accumulation event is identified. Then a dispersal prediction model is generated based on the identified at least one dispersal event. At least one accumulation level of inhalable particles concentration is obtained for the at least one accumulation event. Then a change prediction model for the accumulation level is generated, and a plurality of accumulation prediction models is generated.

According to another embodiment of the present invention, there is provided a computer-implemented method for predicting inhalable particles concentration. In this method, at least one dispersal event is identified using a dispersal prediction model, based on predicted weather information. At least one accumulation event is identified then. Then a variation amount of an accumulation level is obtained for the at least one accumulation event using a change prediction model. Then inhalable particles concentration in the at least one dispersal event and in the at least one accumulation event is predicted in chronological order. The prediction of the inhalable particles concentration in the at least one accumulation event is based on the variation amount of the accumulation level and a plurality of accumulation predication models.

According to another embodiment of the present invention, there is provided a system for modeling prediction of inhalable particles concentration. The system comprises one or more processors, a memory coupled to at least one of the processors, and a set of computer program instructions stored in the memory and executed by at least one of the processors in order to perform the following actions: identifying at least one dispersal event, identifying at least one accumulation event, generating a dispersal prediction model based on the identified at least one dispersal event, obtaining at least one accumulation level of inhalable particles concentration for the at least one accumulation event, generating a change prediction model for the accumulation level, and generating a plurality of accumulation prediction models.

According to another embodiment of the present invention, there is provided a system for predicting inhalable particles concentration. The system comprises one or more processors, a memory coupled to at least one of the processors, and a set of computer program instructions stored in the memory and executed by at least one of the processors in order to perform following actions: identifying at least one dispersal event using a dispersal prediction model, based on predicted weather information, then identifying at least one accumulation event, obtaining a variation amount of an accumulation level for the at least one accumulation event, and predicting inhalable particles concentration in the at least one dispersal event and in the at least one accumulation event in chronological order, wherein the prediction of the inhalable particles concentration in the at least one accumulation event is based on the variation amount of the accumulation level and a plurality of accumulation predication models.

According to another embodiment of the present invention, there is provided a computer program product. The computer program product comprises a computer readable storage medium having program instructions embodied therewith, the program instructions executable by a device to cause the device to perform the method for modeling prediction of inhalable particles concentration.

According to another embodiment of the present invention, there is provided a computer program product, which comprises a computer readable storage medium having program instructions embodied therewith, the program instructions executable by a device to cause the device to perform the method for predicting inhalable particles concentration.

BRIEF DESCRIPTION OF THE DRAWINGS

Through the more detailed description of some embodiments of the present disclosure in the accompanying drawings, the above and other objects, features and advantages of the present disclosure will become more apparent, wherein the same reference generally refers to the same components in the embodiments of the present disclosure.

FIG. 6 is a schematic flowchart of the process for generating a dispersal prediction model in the embodiment as shown in FIG. 2;

FIG. 8 is a schematic flowchart of a method for predicting inhalable particles concentration according to an embodiment of the present invention;

DETAILED DESCRIPTION

Some preferable embodiments will be described in more detail with reference to the accompanying drawings, in which the preferable embodiments of the present disclosure have been illustrated. However, the present disclosure can be implemented in various manners, and thus should not be construed to be limited to the embodiments disclosed herein. On the contrary, those embodiments are provided for the thorough and complete understanding of the present disclosure, and completely conveying the scope of the present disclosure to those skilled in the art.

Figure 1:
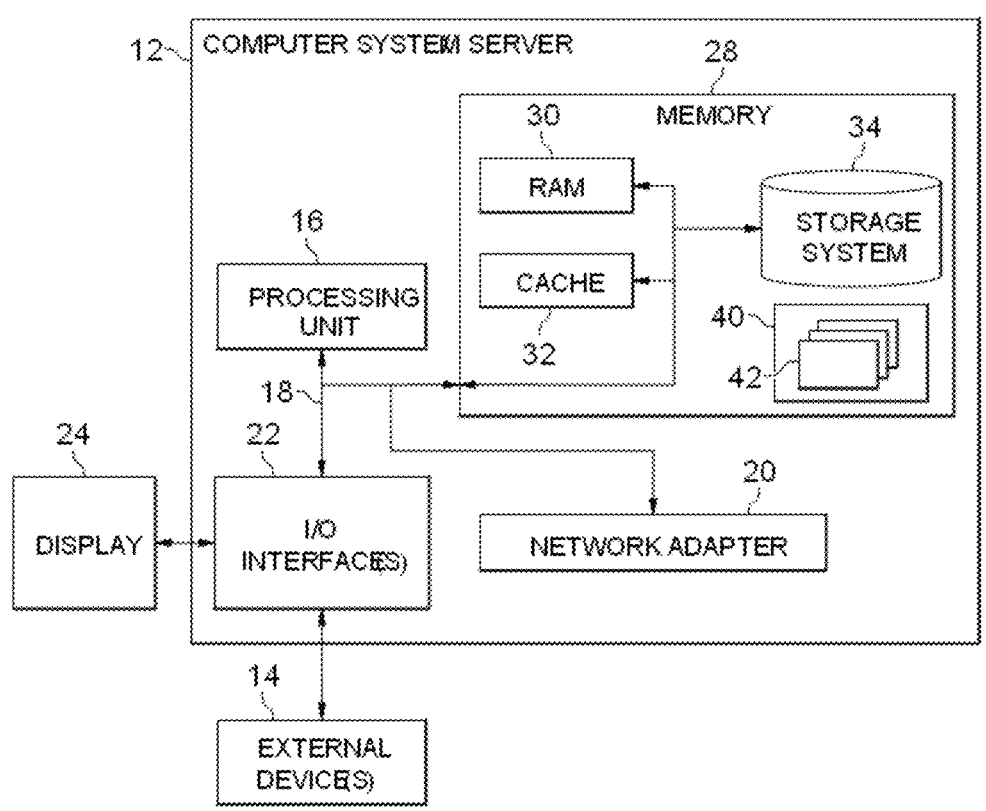
FIG. 1 shows an exemplary computer system which is applicable to implement the embodiments of the present invention.

Referring now to FIG. 1, in which an exemplary computer system/server 12 which is applicable to implement the embodiments of the present invention is shown. Computer system/server 12 is only illustrative and is not intended to suggest any limitation as to the scope of use or functionality of embodiments of the invention described herein.

As shown in FIG. 1, computer system/server 12 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
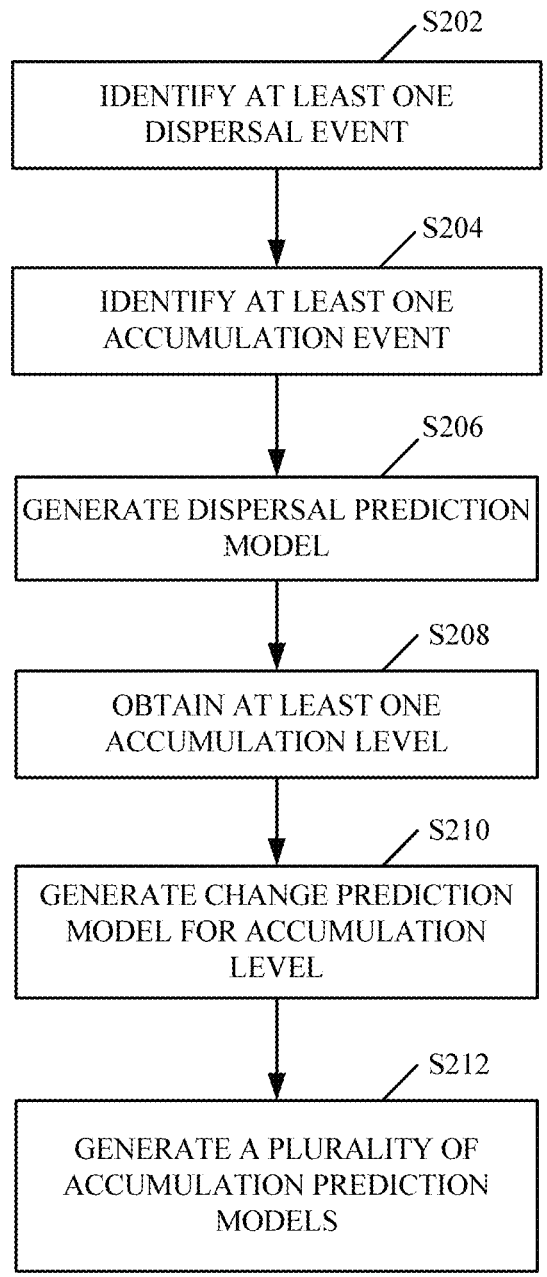
FIG. 2 is a schematic flowchart of a method for modeling prediction of inhalable particles concentration according to an embodiment of the present invention.
Figure 3:
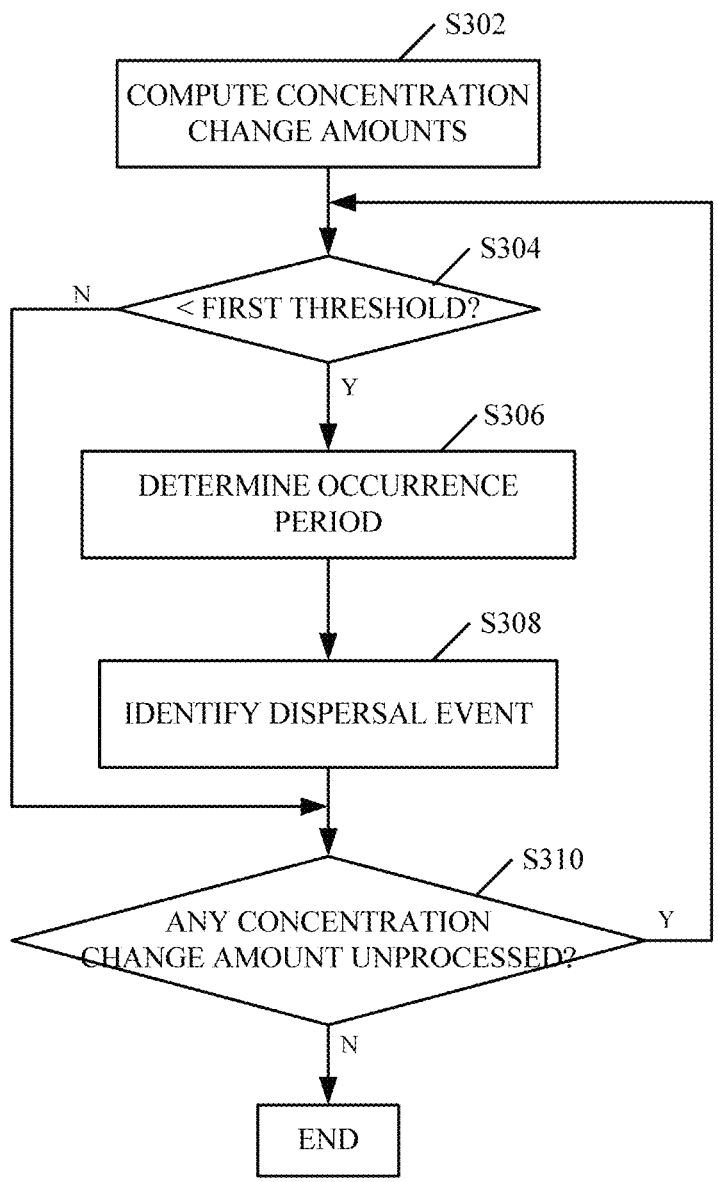
FIG. 3 is a schematic flowchart of the process for identifying at least one dispersal event in the embodiment as shown in FIG. 2.

FIG. 2 shows a schematic flowchart of the method for modeling prediction of inhalable particles concentration. The embodiment will be described in detail in conjunction with the figure.

In the embodiment, the modeling is based on historical observation values of the inhalable particles concentration and historical weather information. In some embodiments of the present invention, the modeling may be executed by any computing device. The inhalable particles concentration may be observed at a certain period (hereinafter referred to as an observation period). The observation period may be, for example, one or several hours, tens of minutes, or several minutes.

At step S202, the computing device may identify at least one dispersal event. In the embodiment, the dispersal event may be defined as an event which indicates a decrease of the inhalable particles concentration.

According to the historical observation values of the inhalable particles concentration during a given period, at least one dispersal event occurring in the given period may be identified. The given period may be much longer than the observation period. For example, the given period may be one or several years, one or several months. The longer the given period is, the more accurate the modeling is.

FIG. 3 shows a flowchart of the process of identifying the dispersal event(s) in the embodiment as shown in FIG. 2. Firstly at step S302, a concentration change amount of the inhalable particles concentration is computed. As described above, the historical observation values of the inhalable particles concentration are obtained at the observation period. The concentration change amount may be computed as a difference between two adjacent historical observation values. In some embodiments of the present invention, the concentration change amount may be computed unit time by unit time. The unit time may be set dependent on the observation period. In some embodiments, the unit time may be set as same as the observation period, or may be larger than the observation period. For example, assume that the observation period is half an hour, the unit time may be set as half of an hour, one hour, two hours, and like as needed. In the case that the unit time is one hour, the concentration change amount may be computed as a difference between the historical observation values at a certain hour ($t_1$) and at the next hour ($t_2$). By this step, the concentration change amount within the respective hours during the given period can be obtained.

Then at step S304, it is determined whether the concentration change amount is less than a first threshold. The first threshold may be less than or equal to zero. If the concentration change amount is not less than the first threshold, it indicates that no dispersal event occurred within that unit time. The process proceeds to step S310. If the concentration change amount is less than the first threshold, it indicates that the inhalable particles concentration decreased within that unit time, and a dispersal event occurred within that unit time.

In response to that the concentration change amount is less than the first threshold, i.e. there is a dispersal event occurred, at step S306, an occurrence period of the dispersal event is determined. In the embodiment, a time period corresponding to the concentration change amount of the dispersal event which is less than the first threshold may be determined as the occurrence period. The occurrence period may be represented by a beginning time and an end time. Then at step S308, the dispersal event is identified which contains the occurrence period and the concentration change amount during the occurrence period.

At step S310, it is checked whether there is remained any concentration change amount unprocessed. If there is the unprocessed concentration change amount, the process proceeds to step S304. If all the concentration change amounts are processed, the process ends.

Figure 4:
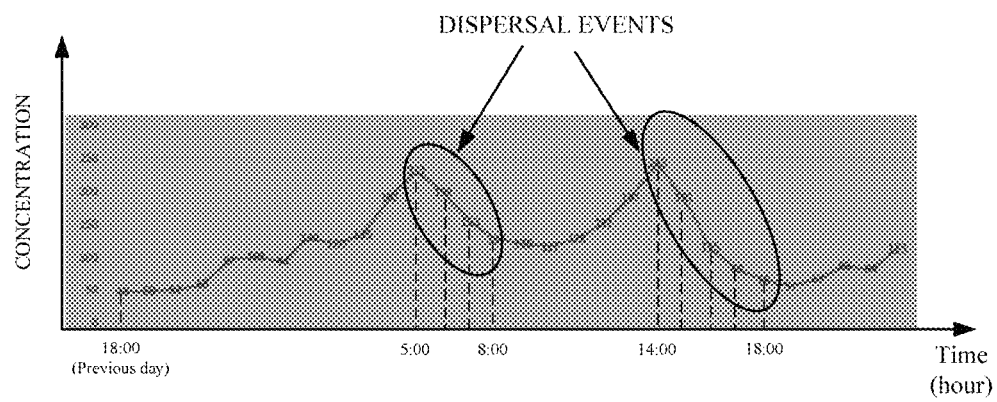
FIG. 4 is a diagram for illustrating the dispersal events.

FIG. 4 illustrates the dispersal event of the embodiment. FIG. 4 shows an exemplary historical curve of the inhalable particles concentration with time. In this example, the inhalable particles concentration was measured at every hour, i.e. the observation period is one hour, and the unit time is set as same as the observation period, i.e. one hour. By computing the concentration change amount hour by hour and comparing the concentration change amount with the first threshold (in this example, the first threshold is set as minus 15 (−15)), several dispersal events can be identified, as shown in FIG. 4. In the example of FIG. 4, the decreasing portions of the curve are identified as the dispersal events. There are seven dispersal events and their occurrence periods are 5:00~6:00, 6:00~7:00, 7:00~8:00, 14:00~15:00, 15:00~16:00, 16:00~17:00, and 17:00~18:00, respectively. In addition, several successive dispersal events may be collectively considered as one dispersal event. In this case, in the example of FIG. 4 two dispersal events are identified and their occurrence periods are 5:00~8:00 and 14:00~18:00 respectively. In the following description, several successive dispersal events are also considered as one dispersal event.

Figure 5:
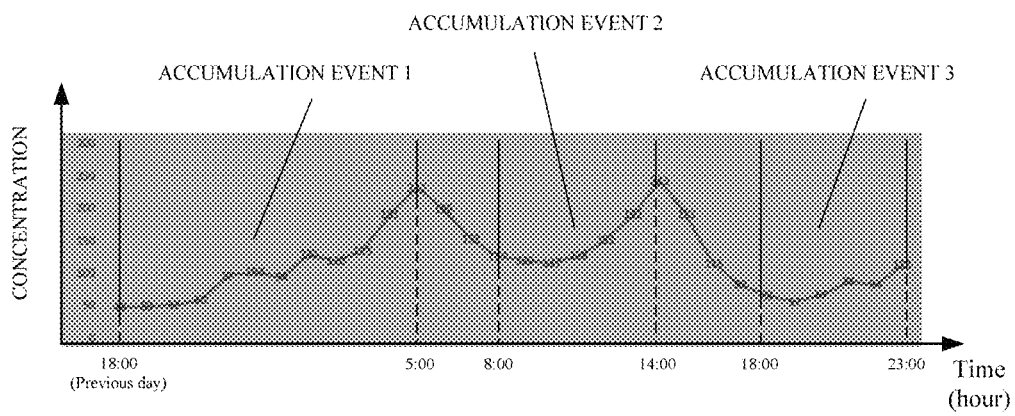
FIG. 5 is a diagram for illustrating the accumulation events.

After the dispersal event(s) is identified, the computing device may identify at least one accumulation event based on the identified dispersal event(s) at step S204. In the embodiment, the accumulation event may be an event which is not the dispersal event. The computing device may determine at least one time period except the occurrence period(s) of the dispersal event(s) in the given period, as the occurrence period of the accumulation event. Therefore the beginning time of the occurrence period of the accumulation event overlaps with the end time of the occurrence period of the previous dispersal event, and the end time of the occurrence period of the accumulation event overlaps with the beginning time of the occurrence period of the next dispersal event. That is, the disperal events and the accumulation event. In the example as shown in FIG. 4, the occurrence periods of the accumulation events are 18:00 (of the previous day)~5:00, 8:00~14:00, and 18:00~23:00, respectively. Then the accumulation events are identified which contains the occurrence period and the historical observation value(s) of the inhalable particles concentration during that occurrence period. Therefore three accumulation events are identified as shown in FIG. 5, and each accumulation event comprises a plurality of the observation values of the inhalable particles concentration.

It should be noted that in the case that the first threshold is set below zero, the decrease of the inhalable particles concentration which is not less than the first threshold may be contained in the accumulation event.

Returning to FIG. 2, at step S206, the computing device generates a dispersal prediction model based on the identified dispersal event(s). In the embodiment, the dispersal prediction model may represent a relationship between the dispersal event and at least one key weather element. The key weather element may be defined as a weather element which may result in the dispersal event. FIG. 6 shows a schematic flowchart of the process for generating a dispersal prediction model in the embodiment as shown in FIG. 2.

As shown in FIG. 6, at step S602, the computing device may establish a first model representing dependency of occurrence of the dispersal event on at least one key weather element based on the historical weather information during the given period. This step may be implemented by performing association analysis on the historical weather information. Generally, association analysis (which is also referred to as "association mining") refers to finding frequent modes or correlations between items in a dataset. It is known to a person skilled in the art that there exist many methods for association analysis, for example, Apriori algorithm, FP-growth algorithm, etc.

In some embodiments of the present invention, a piece of weather information may be represented by an item comprising a weather element and data of the weather element. The weather elements may comprise ground wind speed, ground wind direction, ground dew point temperature, air pressure, ground temperature, temperature inversion, 850 hectopascal (hPa) wind speed, 850 hPa wind direction, 850 hPa temperature, 850 hPa variable temperature, pressure change, 500 hPa wind speed, 500 hPa wind direction, mixed layer height, and the like. After the dispersal event(s) and the accumulation event(s) are identified at step S202, each piece of weather information during the given period may be marked with the dispersal event or the accumulation event.

Then the association analysis may be performed on the marked historical weather information. Any of the above existing methods for association analysis may be used. The marked historical weather information may be considered as the dataset, and the weather elements and the dispersal event may be considered as the items. By means of the association analysis method, the key weather element(s) may be determined and corresponding association rule(s) between the dispersal event and the key weather element(s) may be generated. Thus the first model may be established based on the association rule(s). The first model may be expressed as an occurrence probability of the dispersal event with respect to the key weather element(s). In some embodiments of the present invention, the first model may include several association rules for the key weather element(s) that would result in the occurrence of the dispersal event. For example, the association rules may include: 1) the ground wind speed is not less than 4 m/s and the ground wind direction is north; 2) value of the temperature inversion is less than zero degree; 3) decrease of the ground temperature within 24 hours is greater than 4 degrees centigrade, etc.

Then at step S606, the computing device computes a decreased amount of the inhalable particles concentration based on the observation values of the inhalable particles concentration during the dispersal event(s). In the embodiment, the decrease amount may be computed as a difference between the observation value at time $t_2$ and the observation value at time $t_1$, wherein the time $t_1$, $t_2$ is within the occurrence period of the same dispersal event. In some embodiments of the present invention, the decreased amount may be computed unit time by unit time. In this case, the time difference $(t_2-t_1)$ equals to the unit time. At step S608, the computing device establishes a second model representing a decreased amount of the inhalable particles concentration as a function of the key weather element(s). The second model may be used to compute the decreased amount according to the data of the key weather element(s) during the dispersal event(s). In some embodiments of the present invention, the second model may be expressed as a linear function which takes the decreased amount of the inhalable particles concentration as a variable and takes the key weather element(s) as an argument(s). For example, the second model may be expressed as follows:

$$\Delta Con = F_2(W1, W2, \ldots, Wn)$$

where $\Delta Con$ represents the decreased amount of the inhalable particles concentration, $F_2(\cdot)$ represents the linear function, and W1, W2, ..., Wn represent the key weather elements. The second model may be established by training the second model using the decreased amount(s) of the inhalable particles concentration and the data of the key weather element(s) during the dispersal event(s) to determine the coefficients of the arguments of the linear function.

In some embodiments of the present invention, a time feature may be taken into account for the second model. The time feature may indicate an attribute of the time, for example, which season of a year, which month of a year, weekday or weekend, the time of a day, or any combination thereof. The time feature may be extracted from the occurrence period(s) of the dispersal event(s). In this case, the second model may be expressed as follows:

$$\Delta Con = F_2(W1, W2, \ldots, Wn, T_f)$$

where $T_f$ represents the time feature. The training of the second model may use the decreased amount(s) of the inhalable particles concentration, the data of the key weather element(s) and the time feature during the dispersal event(s).

Those skilled in the art will appreciate that any existing training method may be employed to train the second model. Also those skilled in the art will appreciate that the second model is not limited to the form as described above, and any other form of model may be employed.

It should be noted that, although steps S602, S606 and S608 are described sequentially, step S602 and steps 606, S608 may be exectued in another order. For example, step S602 and either of steps 606 and S608 may be executed concurrently, or either of steps S606 and S608 may be executed prior to step S602.

Then at step S610, the dispersal prediction model is generated to include the first model and the second model.

Figure 7:
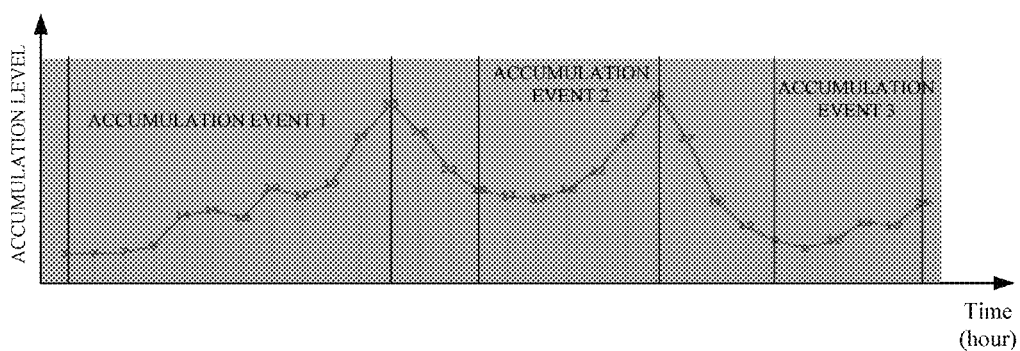
FIG. 7 is a diagram for illustrating the accumulation level.

Returning to FIG. 2, at step S208, the computing device obtains at least one accumulation level of inhalable particles concentration for the at least one accumulation event. In the embodiment, an accumulation level of inhalable particles concentration is introduced to represent accumulation degree of the inhalable particles during the accumulation event. The accumulation level may be identified based on the inhalable particles concentration. In some embodiments of the present invention, the accumulation level may be equal to the inhalable particles concentration. In some embodiments of the present invention, a mapping between the accumulator level and the inhalable particles concentration may be predefined. For each observation value of the inhalable particles concentration during each of the accumulation events, the corresponding accumulation level may be obtained based on the predefined mapping. For example, the mapping may be defined as follows:

accumulation level=Mod(inhalable particles concentration/$N$)

where Mod is a modulus operator, and N is a natural number. In the example of FIG. 5, the accumulation levels during three accumulation events can be calculated, as shown in FIG. 7. In this example, N equals to 7. In some embodiments of the present invention, the accumulation level may also be obtained unit time by unit time.

In some embodiments of the present invention, the accumulation levels for each accumulation event may be further filtered such that the filtered accumulation levels are monotonically increasing in each of the accumulation events. Firstly it is checked whether the current accumulation level is less than the previous accumulation level. If the current accumulation level is less than the previous accumulation level, it means that the inhalable particles concentration is decreased, and thus the current accumulation level needs to be modified. In one embodiment, the current accumulation level may be modified to the previous accumulation level. In another embodiment, the current accumulation level may be modified to an interpolated accumulation level between the previous accumulation level and the next accumulation level which is not less than the previous accumulation level. By modifying the accumulation level which is less than the previous accumulation level to be equal to or greater than the previous accumulation level, the accumulation levels can be monotonically increasing in the accumulation event.

Then at step S210, the computing device generate a change prediction model for the accumulation level. In the embodiment, the change prediction model represents a variation amount of the accumulation level as a function of the key weather element(s). That is, the change prediction model describes the variation of the accumulation level with respect to the key weather element(s).

Firstly the computing device may compute a variation amount of the accumulation level for the at least one accumulation event identified at step S204. In the embodiment, the variation amount may be computed as a difference between the accumulation level at time $t_1$ and the accumulation level at time $t_2$, wherein the time $t_1$, $t_2$ is within the occurrence period of the same accumulation event. In some embodiments of the present invention, the variation amount may be computed unit time by unit time. Then the computing device may establish the change prediction model. For example, the change prediction model may be expressed as the following linear function:

$$\Delta Acc = F_3(W1, W2, \ldots, Wn)$$

where $\Delta Acc$ represents the variation amount of the accumulation level, $F_3(\cdot)$ represents the linear function, and W1, W2, . . . , Wn represents the key weather elements. The data of the key weather element(s) and the variation amounts of accumulation level during the accumulation event(s) are used to train the change prediction model to determine the coefficient(s) of the key weather element(s).

In some embodiments of the present invention, the time feature may be taken into account for the change prediction model. The time feature may be same as that in the second model. The time feature may be extracted from the occurrence period(s) of the accumulation event(s). In this case, the change prediction model may be expressed as the follows:

$$\Delta Acc = F_3(W1, W2, \ldots, Wn, T_f)$$

where $T_f$ represents the time feature. The training of the change prediction model may use the variation amounts of accumulation level, the data of the key weather element(s) and the time feature during the accumulation event(s).

Those skilled in the art will appreciate that any existing training method may be employed to train the change prediction model. Also those skilled in the art will appreciate that the change prediction model is not limited to the form as described above, and any other form of model may be employed.

At step S212, the computing device generates a plurality of accumulation prediction models. In the embodiment, the accumulation prediction model may be a function of the accumulation level and the key weather element(s). In this step, according to the accumulation level(s) obtained at step S208, a range of accumulation level may be determined. Then the range of accumulation level may be divided into multiple sub-ranges, and each sub-range is considered as a prediction set. As described above, the accumulation level represents the accumulation degree of the inhalable particles, and therefore different prediction sets may be used to represent different pollution levels, such as low pollution, light pollution, medium pollution, heavy pollution, severe pollution and high pollution etc. In some embodiments of the present invention, the number of the prediction sets may be determined as necessary.

In the above example, six prediction sets may be grouped and may be shown as the following Table 1:

TABLE 1

| Prediction Set | Range of Accumulation Level | Inhalable Paricles Concentration |
| --- | --- | --- |
| Low pollution | 0-5 | 0-35 |
| Light pollution | 6-15 | 36-105 |
| Medium pollution | 16-26 | 106-182 |
| Heavy pollution | 27-35 | 183-245 |
| Severe pollution | 36-50 | 246-350 |
| High pollution | ≥51 | ≥351 |

Then for each of the prediction sets, the computing device generates an accumulation prediction model representing the inhalable particles concentration as a function of the accumulation level and the key weather element(s). In some embodiments of the present invention, the accumulation prediction model may be expressed as a linear function which takes the inhalable particles concentration as a variable and takes the accumulation level and the key weather elements as arguments. For example, the accumulation prediction model may be expressed as follows:

$$Con = F_4(Acc, W1, W2, \ldots, Wn)$$

where Con represents the inhalable particles concentration, Acc represents the accumulation level, $F_4(\cdot)$ represents the linear function, and W1, W2, . . . , Wn represents the key weather elements. In the generation of the accumulation prediction model for each prediction set, the accumulation levels in that prediction set and the data of the key weather element(s) during the occurrence periods of the accumulation events in that prediction set are used to train the accumulation prediction model to determine the coefficients of the arguments.

In some embodiments of the present invention, the time feature may be taken into account for the accumulation prediction model. The time feature may be same as that in the second model. The time feature may be extracted from the occurrence period(s) of the accumulation event(s). In this case, the accumulation prediction model may be expressed as the follows:

$$Con = F_4(Acc, W1, W2, \ldots, Wn, T_f)$$

where $T_f$ represents the time feature. The training of the accumulation prediction model may use the accumulation levels, the data of the key weather element(s) and the time feature during the accumulation events in the prediction set.

Those skilled in the art will appreciate that any existing training method can be employed to train the accumulation prediction model. Also those skilled in the art will appreciate that the accumulation prediction model is not limited to the form as described above, and any other form of model may be employed.

In the above example, six accumulation prediction models are generated for the low pollution prediction, the light pollution prediction, the medium pollution prediction, the heavy pollution prediction, the severe pollution prediction, and the high pollution prediction, respectively.

It should be noted that, although steps S202 to S212 are described sequentially in the embodiment, some steps may be executed in another order. For example, step 206 may be executed concurrently with step S208. Alternatively, step S208 may be executed prior to step S206.

It can be seen from the above description that the method according to the embodiment of the present invention utilizes different segments of the range of the accumulation level to refine the pollution level, and models the prediction of the inhalable particles concentration hierarchically, thus the low pollution and the high pollution can be separated precisely.

FIG. 8 shows a schematic flowchart of the method for predicting the inhalable particles concentration according to an embodiment of the present invention. The embodiment will be described in detail in conjunction with the figure.

In the embodiment, the prediction of the inhalable particles concentration is based on predicted weather information and utilizes the dispersal prediction model, the change prediction model, and the plurality of accumulation prediction models generated by the method as shown in FIG. 2. It will be appreciated for those skilled in the art that the prediction of the inhalable particles concentration can be implemented by any computing device.

Figure 9:
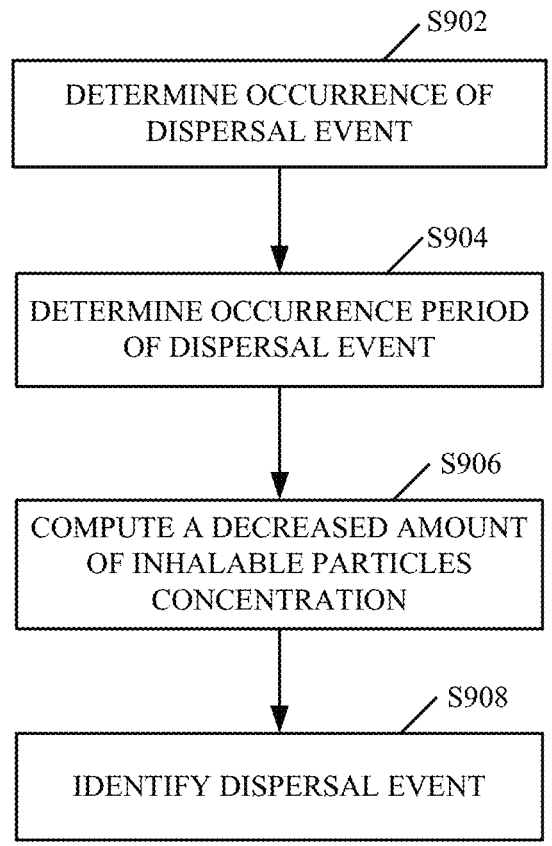
FIG. 9 is a schematic flowchart of the process for identifying at least one dispersal event in the embodiment as shown in FIG. 8.

As shown in FIG. 8, at step S802, the computing device identifies at least one dispersal event. In the embodiment, according to the predicted weather information during a prediction period and the dispersal prediction model, the dispersal event(s) within the prediction period may be identified. FIG. 9 shows the process of identifying the dispersal event(s).

As shown in FIG. 9, at step S902, occurrence of the dispersal event may be determined using the first model of the dispersal prediction model. As described above, the dispersal prediction model includes the first model and the second model. The first model represents the dependency of occurrence of a dispersal events on the key weather element(s), and may be a rule model. In this step, firstly the key weather element(s) and predicted data thereof may be extracted from the predicted weather information according to the first model. Then the occurrence of the dispersal event may be determined by checking whether the predicted data of the key weather element(s) meet the rules contained in the first model. The determination may be executed unit time by unit time. The unit time may be set as an hour, half an hour, etc. which is dependent on a prediction interval of the predicted weather information. Then at step S904, the occurrence period(s) of the dispersal event(s) may be determined based on the determination of the dispersal event(s). As described above, the occurrence period may be represented by a beginning time and an end time.

Then at step S906, the computing device computes a decreased amount of the inhalable particles concentration during the occurrence period determined at step S904 using the second model. As described above, the second model represents the decreased amount of the inhalable particles concentration as a function of the key weather elements and, optionally, the time feature, and may be expressed as a linear function. For each determined occurrence period, the predicted data of the key weather element(s) and, optionally the time feature, during that occurrence period are used as the input of the second model, to compute the decreased amount of the inhalable particles concentration. In some embodiments of the present invention, the decreased amount may be computed unit time by unit time. The predicted data of the key weather element(s) may be extracted from the predicted weather information during that occurrence period. The time feature may be extracted from that occurrence period. Finally at step S908, the computing device may identify the dispersal event(s) which contains the occurrence period and the decreased amount of the inhalable particles concentration during the occurrence period. In some embodiments of the invention, multiple successive dispersal events may constitute one dispersal event.

After identifying the dispersal event(s), at step S804, the computing device may identify at least one accumulation event within the prediction period based on the dispersal event(s) identified at step S802. In this step, at least one time period within the prediction period except the occurrence period(s) of the dispersal event(s) may be determined as the occurrence period(s) of the accumulation event(s). Then at least one accumulation event(s) may be identified which contains the occurrence period and the predicted weather information during that occurrence period. Obviously the dispersal event(s) and the accumulation event(s) will occur alternately.

Returning to FIG. 8, at step S806, the computing device obtains a variation amount of an accumulation level for each of the identified accumulation event(s) using the change prediction model. As described above, the change prediction model represents a variation amount of the accumulation level as a function of the key weather element(s) and, optionally, the time feature. Therefore for each of the accumulation event(s), the predicted data of the key weather element(s) during the occurrence period of that accumulation event and optionally the time feature are used as the inputs of the change prediction model, to compute the variation amount of the accumulation level. The predicted data of the key weather element(s) may be extracted from the predicted weather information during the occurrence period of that accumulation event. The time feature may be extracted from the occurrence period of that accumulation event. In some embodiments of the present invention, the variation amount may be computed unit time by unit time.

Then at step S808, the inhalable particles concentration in each of the dispersal event(s) and in each of the accumulation event(s) is predicted in chronological order according to the occurrence periods of the dispersal event(s) and accumulation event(s).

Figure 10:
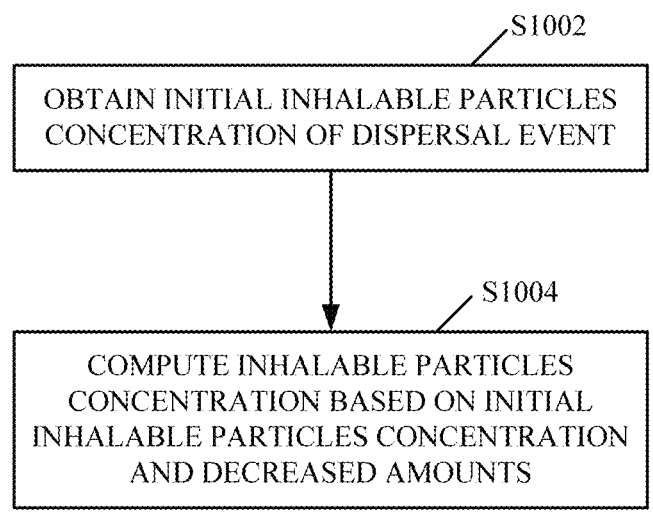
FIG. 10 is a schematic flowchart of the process for predicting the inhalable particles concentration in the dispersal event.

In some embodiments of the present invention, the inhalable particles concentration in the dispersal e-vent may be predicted based on the decreased amount of the inhalable particles concentration in the dispersal event. FIG. 10 shows a flowchart of the process of predicting the inhalable particles concentration in the dispersal event. As shown in FIG. 10, at step S1002, an initial inhalable particles concentration of the current dispersal event is obtained. In this step, it is checked whether the current dispersal event follows an accumulation event. If the current dispersal event follows an accumulation event, the inhalable particles concentration at the end time of the occurrence period of that accumulation event may be obtained. As describd above, the end time of the occurrence period of the previous accumulation or dispersal event overlaps with the beginning time of the occurrence period of the current dispersal or accumulation event. Thus the predicted inhalable particles concentration at the end time of the occurrence period of that accumulation event is used as the initial inhalable particles concentration of the current dispersal event. If the current dispersal event follows no accumulation event, which means that the current dispersal event is the first event in the prediction period, an observation value of the inhalable particles concentration at the beginning time of the prediction period is obtained as the initial inhalable particles concentration. The prediction of the inhalable particles concentration of the accumulation event will be described later.

Then at step S1004, the inhalable particles concentration of the current dispersal event is computed based on the initial inhalable particles concentration and the decreased amount of the inhalable particles concentration in the current dispersal event. As mentioned above, the decreased amount of the inhalable particles concentration is predicted unit time by unit time at step S906. The inhalable particles concentration at time $t_2$ in the current dispersal event may be computed based on the inhalable particles concentration at time $t_1$ and the decreased amount of the inhalable particles concentration computed at time $t_2$ (which equals to ($t_1$+unit time)). In the embodiment, the inhalable particles concentration at time $t_2$ may be computed by subtracting the decreased amount of the inhalable particles concentration computed at time $t_2$ from the inhalable particles concentration at time $t_1$.

In some embodiments of the present invention, the prediction of the inhalable particles concentration of the accumulation event is based on the accumulation level(s) in the accumulation event and corresponding accumulation prediction model(s). As described above, the accumulation prediction model represents the inhalable particles concentration as a function of the accumulation level, the key weather element(s) and optionally the time feature. Each prediction model may correspond to a certain segment of a range of the accumulation level.

Figure 11:
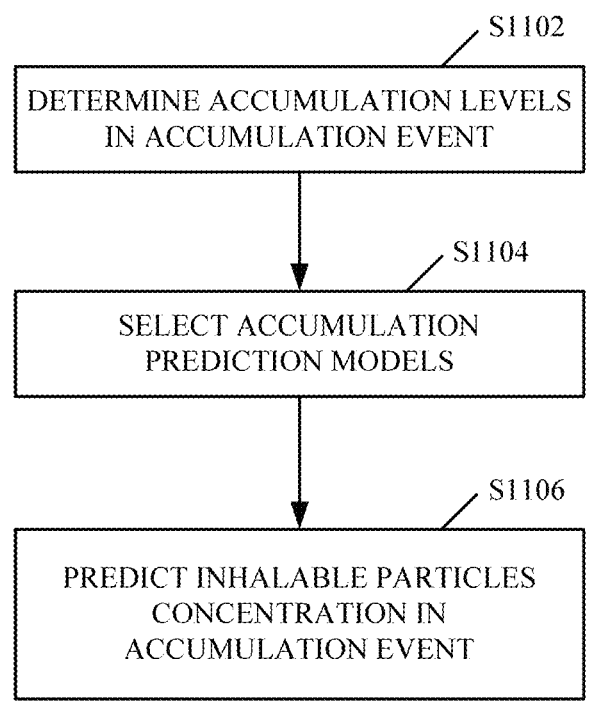
FIG. 11 is a schematic flowchart of the process for predicting the inhalable particles concentration in the accumulation event.

FIG. 11 shows a schematic flowchart of the process for predicting the inhalable particles concentration in the accumulation event. As shown in FIG. 11, at step S1102, the accumulation level in the current accumulation event is determined. Firstly, an initial accumulation level of the current accumulation event may be obtained. The initial accumulation level may be dependent on whether the current accumulation event follows a dispersal event or not. If the current accumulation event follows a dispersal event, the accumulation level at the end time of the occurrence period of the dispersal event may be computed as the initial accumulation level of the accumulation event. In some embodiments of the present invention, based on the predefined mapping between the accumulation level and the inhalable particles concentration, the accumulation level may be computed. It should be noted that the predefined mapping is same as that used in the modeling of the prediction of inhalable particles concentration. The inhalable particles concentration at the end time of the occurrence time of the dispersal event may be obtained according to the process as shown in FIG. 10. If the current accumulation event follows no dispersal event, it means that the accumulation event will occur firstly in the prediction period. Then the observation value of the inhalable particle concentration at the beginning time of the prediction period may be obtained, and the corresponding accumulation level may be computed as the initial accumulation level of the current accumulation event. Then the accumulation level in the current accumulation event may be computed, unit time by unit time, based on the initial accumulation level and the variation amount of the accumulation level in the current accumulation event. As mentioned above, the variation amount of the accumulation level is computed unit time by unit time at step S804. The accumulation level at time $t_2$ in the current accumulation event may be computed based on the accumulation level at time $t_1$ and the variation amount of the accumulation level computed at time $t_2$ (which equals to ($t_1$+unit time)). In the embodiment, the accumulation level at time $t_2$ may be computed by adding the variation amount of the accumulation level at time $t_2$ to the accumulation level at time $t_1$.

Then at step S1104, an accumulation prediction model is selected based on the accumulation level determined at step S1102. If there are multiple accumulation levels in the accumulation event, multiple accumulation prediction models will be selected. As described above, different accumulation prediction models correspond to different segments of the range of the accumulation level, which represent different pollution levels. In this way, the prediction accuracy can be improved.

At step S1106, the inhalable particles concentration of the accumulation event is predicted using the selected accumulation prediction model. In this step, the accumulation level, the predicted data of the key weather element(s) and optionally the time feature during the accumulation event are used as the inputs of the selected accumulation prediction model, to compute the inhalable particles concentration. The predicted data of the key weather element(s) may be extracted from the predicted weather information during the occurrence period of the accumulation event. The time feature may be extracted from the occurrence period of the accumulation event.

By the processes as shown in FIGS. 10, 11, the inhalable particles concentration in each dispersal event and each accumulation event can be predicted, and thus the inhalable particles concentration during the prediction period can be predicted.

It can be seen from the above description that the method according to the embodiment as shown in FIGS. 8, 9, 10 and 11 can select different accumulation prediction models by computing the accumulation levels for different pollution levels, and thus predict the inhalable particles concentration more accurately.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method for modeling prediction of inhalable particles concentration comprising:
   identifying at least one dispersal event indicating a decrease of an inhalable particles concentration over an occurrence period;
   identifying at least one accumulation event, a time period of said accumulation event overlapping with a beginning or end of an occurrence period of an identified dispersal event;
   generating a dispersal prediction model based on the identified at least one dispersal event, said generating a dispersal prediction model comprising:

establishing a first model representing dependency of occurrence of the dispersal event on at least one key weather element based on a historical weather information during a given time period;

computing a decreased amount of the inhalable particles concentration based on observation values of the inhalable particles concentration during the at least one dispersal event, said inhalable particles concentration observed at a time period spanning several minutes or spanning up to several hours; and establishing a second model representing a decreased amount of the inhalable particles concentration as a function of the at least one key weather element, wherein the first model and the second model constitutes the dispersal prediction model;

obtaining at least one accumulation level of inhalable particles concentration for the at least one accumulation event;

generating a change prediction model for the accumulation level, the change prediction model representing a variation amount of the accumulation level as a function of the at least one key weather element; and generating a plurality of accumulation prediction models by dividing a range of the accumulation level into multiple segments; and establishing, for each of the multiple segments, a respective accumulation prediction model representing the inhalable particles concentration as a function of the accumulation level and at least one key weather element.

2. The method according to claim 1 wherein identifying at least one dispersal event comprises:

computing a concentration change amount of the inhalable particles concentration, based on observation values of the inhalable particles concentration, said concentration change amount computed as a difference of observed historical concentration amount values between two adjacent historical observation periods during the given time period;

determining a time period corresponding to the concentration change amount as an occurrence period of a dispersal event, in response to that the concentration change amount is less than a first threshold, wherein the first threshold is not greater than zero; and identifying the at least one dispersal event containing the occurrence period and the concentration change amount of the inhalable particles concentration.

3. The method according to claim 1 wherein identifying at least one accumulation event comprises:

determining at least one time period except the occurrence period of the at least one dispersal event, as an occurrence period of an accumulation event; and identifying the at least one accumulation event containing the occurrence period and observation value of the inhalable particles concentration during the occurrence period.

4. The method according to claim 1 wherein generating the change prediction model for the accumulation level comprises:

computing a variation amount of the accumulation level for the at least one accumulation event; and establishing the change prediction model representing the variation amount of the accumulation level as a function of the at least one key weather element.

5. A computer-implemented method for predicting inhalable particles concentration comprising:

identifying at least one dispersal event using a dispersal prediction model, based on predicted weather information, said at least one dispersal event indicating a decrease of an inhalable particles concentration over an occurrence period, said identifying at least one dispersal event containing the occurrence period comprising:

determining occurrence of at least one dispersal event based on the predicted weather information using a first model of the dispersal prediction model based on historical weather information during a given period;

determining an occurrence period of the at least one dispersal event; and computing a decreased amount of the inhalable particles concentration in the at least one dispersal event based on the predicted weather information during the at least one dispersal event using a second model of the dispersal prediction model;

identifying the at least one dispersal event containing the occurrence period and the decreased amount of the inhalable particles concentration during the occurrence period;

identifying at least one accumulation event, a time period of said accumulation event overlapping with a beginning or end of an occurrence period of an identified dispersal event;

using a change prediction model for obtaining a variation amount of an accumulation level for the at least one accumulation event as a function of the at least one key weather element; and predicting inhalable particles concentration in the at least one dispersal event and in the at least one accumulation event in chronological order;

wherein the prediction of the inhalable particles concentration in the at least one accumulation event is based on the variation amount of the accumulation level and a plurality of accumulation prediction models, each accumulation prediction model of said plurality obtained by dividing a range of the accumulation level into multiple segments; and establishing, for each of the multiple segments, an accumulation prediction model representing the inhalable particles concentration as a function of the accumulation level and at least one key weather element.

6. The method according to claim 5 wherein identifying at least one accumulation event comprises:

determining at least one time period except an occurrence period of the at least one dispersal event, as an occurrence period of at least one accumulation event; and identifying the at least one accumulation event containing the occurrence period and the predicted weather information during the occurrence period.

7. The method according to claim 5 wherein predicting inhalable particles concentration in the at least one accumulation event comprises: for each of the at least one accumulation event, determining the accumulation level in the current accumulation event;

selecting an accumulation prediction model based on the determined accumulation level; and predicting the inhalable particles concentration in the current accumulation event using the selected accumulation prediction model, based on the determined accumulation level and the predicted weather information during the current accumulation event.

8. The method according to claim 7 wherein determining the accumulation level in the current accumulation event comprises:

obtaining an initial accumulation level of the current accumulation event; and computing the accumulation level based on the initial accumulation level and the variation amount of the accumulation level in the current accumulation event.

9. The method according to claim 8 wherein obtaining an initial accumulation level of the current accumulation event comprises:

in response to the current accumulation event following a dispersal event, computing the accumulation level at an end time of an occurrence period of the dispersal event, as the initial accumulation level, and in response to the current accumulation event follows no dispersal event, computing the accumulation level at a beginning time for prediction, as the initial accumulation level.

10. The method according to claim 5 wherein predicting inhalable particles concentration in the at least one dispersal event comprises: for each of the at least one dispersal event, obtaining an initial inhalable particles concentration of the current dispersal event; and computing the inhalable particles concentration based on the initial inhalable particles concentration and a decreased amount of the inhalable particles concentration in the current dispersal event.

11. The method according to claim 10 wherein obtaining an initial inhalable particles concentration of the current dispersal event comprises:

in response to the current dispersal event following an accumulation event, obtaining the inhalable particles concentration at an end time of an occurrence period of the accumulation event, as the initial inhalable particles concentration, and in response to the current dispersal event follows no accumulation event, obtaining an observation value of the inhalable particles concentration at a beginning time for prediction, as the initial inhalable particles concentration, said inhalable particles concentration observed at a time period spanning several minutes or spanning up to several hours.

12. A system for modeling prediction of inhalable particles concentration comprising:

one or more processors;

a memory coupled to at least one of the processors;

a set of computer program instructions stored in the memory and executed by at least one of the processors in order to perform actions of:

identifying at least one dispersal event indicating a decrease of an inhalable particles concentration over an occurrence period;

identifying at least one accumulation event, a time period of said accumulation event overlapping with a beginning or end of an occurrence period of an identified dispersal event;

generating a dispersal prediction model based on the identified at least one dispersal event, said generating a dispersal prediction model based on the identified at least one dispersal event comprising:

establishing a first model representing dependency of occurrence of the dispersal event on at least one key weather element based on a historical weather information during a given time period;

computing a decreased amount of the inhalable particles concentration based on observation values of the inhalable particles concentration during the at least one dispersal event, said inhalable particles concentration observed at a time period spanning several minutes or spanning up to several hours; and establishing a second model representing a decreased amount of the inhalable particles concentration as a function of the at least one key weather element, wherein the first model and the second model constitutes the dispersal prediction model;

obtaining at least one accumulation level of inhalable particles concentration for the at least one accumulation event;

generating a change prediction model for the accumulation level, the change prediction model representing a variation amount of the accumulation level as a function of the at least one key weather element; and generating a plurality of accumulation prediction models by dividing a range of the accumulation level into multiple segments; and establishing, for each of the multiple segments, an accumulation prediction model representing the inhalable particles concentration as a function of the accumulation level and at least one key weather element.

13. The system according to claim 12 wherein the set of computer program instructions is executed by at least one of the processors in order to generate the change prediction model for the accumulation level by:

computing a variation amount of the accumulation level for the at least one accumulation event; and establishing the change prediction model representing the variation amount of the accumulation level as a function of the at least one key weather element.

14. A system comprising:
one or more processors;
a memory coupled to at least one of the processors;
a set of computer program instructions stored in the memory and executed by at least one of the processors in order to perform actions of:

identifying at least one dispersal event using a dispersal prediction model, based on predicted weather information, said at least one dispersal event indicating a decrease of an inhalable particles concentration over an occurrence period, said identifying at least one dispersal event comprising:

determining occurrence of at least one dispersal event based on the predicted weather information, using a first model of the dispersal prediction model based on a historical weather information during a given time period;

determining an occurrence period of the at least one dispersal event;

computing a decreased amount of the inhalable particles concentration in the at least one dispersal event based on the predicted weather information during the at least one dispersal event using a second model of the dispersal prediction model; and identifying the at least one dispersal event containing the occurrence period and the decreased amount of the inhalable particles concentration during the occurrence period;

identifying at least one accumulation event, a time period of said accumulation event overlapping with a beginning or end of an occurrence period of an identified dispersal event;

using a change prediction model for obtaining a variation amount of an accumulation level for the at least one accumulation event as a function of the at least one key weather element; and predicting inhalable particles concentration in the at least one dispersal event and in the at least one accumulation event in chronological order;

wherein the prediction of the inhalable particles concentration in the at least one accumulation event is based on the variation amount of the accumulation level and a plurality of accumulation prediction models, each accumulation prediction model of said plurality obtained by dividing a range of the accumulation level into multiple segments; and establishing, for each of the multiple segments, an accumulation prediction model representing the inhalable particles concentration as a function of the accumulation level and at least one key weather element.

15. The system according to claim 14 wherein the set of computer program instructions is executed by at least one of the processors in order to predict the inhalable particles concentration in the at least one accumulation event by: for each of the at least one accumulation event, determining the accumulation level in the current accumulation event;

selecting an accumulation prediction model based on the determined accumulation level; and predicting the inhalable particles concentration in the current accumulation event using the selected accumulation prediction model, based on the determined accumulation level and the predicted weather information during the current accumulation event.

16. A computer program product comprising a computer readable storage medium having program instructions embodied therewith, the program instructions executable by a processor device to cause the processor device to perform a method for modeling prediction of inhalable particles concentration, said method comprising:

identifying at least one dispersal event, a dispersal event indicating a decrease of an inhalable particles concentration over an occurrence period;

identifying at least one accumulation event based on said identified at least one dispersal event, an accumulation event occurring over a time period different than said occurrence period of said at least one dispersal event;

generating a dispersal prediction model based on the identified at least one dispersal event, said generating a dispersal prediction model based on the identified at least one dispersal event comprising:

establishing a first model representing dependency of occurrence of the dispersal event on at least one key weather element based on a historical weather information during a given time period;

computing a decreased amount of the inhalable particles concentration based on observation values of the inhalable particles concentration during the at least one dispersal event, said inhalable particles concentration observed at a time period spanning several minutes or spanning up to several hours; and establishing a second model representing a decreased amount of the inhalable particles concentration as a function of the at least one key weather element, wherein the first model and the second model constitutes the dispersal prediction model;

obtaining at least one accumulation level of inhalable particles concentration for the at least one accumulation event;

generating a change prediction model for the accumulation level, the change prediction model representing a variation amount of the accumulation level as a function of the at least one key weather element; and generating a plurality of accumulation prediction models by dividing a range of the accumulation level into multiple segments; and establishing, for each of the multiple segments, an accumulation prediction model representing the inhalable particles concentration as a function of the accumulation level and at least one key weather element.

17. A computer program product comprising a computer readable storage medium having program instructions embodied therewith, the program instructions executable by a device to cause the device to perform a method for predicting inhalable particles concentration of claim 5.

18. The method according to claim 1, wherein said establishing a first model representing dependency of occurrence of the dispersal event on at least one key weather element comprises:

performing association analysis on the historical weather information to find frequent modes or correlations between weather element items in a dataset of historical weather information;

generating one or more association rules between the dispersal event and the key weather elements, said association rules for the key weather elements that result in the occurrence of the dispersal event; and establishing said first model based on the one or more association rules.

19. The method according to claim 1, wherein said second model is represented as a linear function of key weather elements with the second model further being a function of a time feature during the dispersal event, said second model being trained based on the decreased amount of inhalable particles concentration, the data of the key weather elements and the time feature, to determine model coefficients for the key weather elements.

20. The method according to claim 1, wherein said change prediction model representing a variation of the accumulation level is a linear function of key weather elements, the change prediction model being trained based on the data of the key weather elements and the variation amounts of accumulation level during the accumulation event to determine model coefficients for the key weather elements.

21. The method according to claim 1, wherein said obtaining at least one accumulation level of inhalable particles concentration for the at least one accumulation event comprises:

using a predefined mapping between accumulation level and observed inhalable particles concentration.

22. The method according to claim 1, wherein said obtaining at least one accumulation level of inhalable particles concentration for the at least one accumulation event comprises:

determining whether a current accumulation level is less than a previous accumulation level; and responsive to said determining, if the current accumulation level is less than the previous accumulation level, one of:

modifying the current accumulation level to the previous accumulation level; or modifying the current accumulation level to an interpolated accumulation level between the previous accumulation level and a next accumulation level which is not less than the previous accumulation level.

23. The method according to claim 5, wherein said first model of the dispersal prediction model represents a dependency of occurrence of the dispersal event on at least one key weather element, said first model established by:

performing association analysis on the historical weather information to find frequent modes or correlations between weather element items in a dataset of historical weather information;

generating one or more association rules between the dispersal event and the key weather elements, said association rules for the key weather elements that result in the occurrence of the dispersal event; and establishing said first model based on the one or more association rules.

24. The method according to claim 5, wherein said second model of the dispersal prediction model is represented as a linear function of key weather elements with the second model further being a function of a time feature during the dispersal event, said second model being trained based on the decreased amount of inhalable particles concentration, the data of the key weather elements and the time feature.

25. The method according to claim 7, wherein said determining the accumulation level in the current accumulation event comprises:

using a predefined mapping between accumulation level and observed inhalable particles concentration.

* * * * *